US007394292B2

(12) United States Patent
Hosokawa et al.

(10) Patent No.: US 7,394,292 B2
(45) Date of Patent: Jul. 1, 2008

(54) SIMPLE SIGNAL TRANSMISSION CIRCUIT CAPABLE OF DECREASING POWER CONSUMPTION

(75) Inventors: Akio Hosokawa, Kanagawa (JP); Masayuki Yamaguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 933 days.

(21) Appl. No.: 10/824,592

(22) Filed: Apr. 15, 2004

(65) Prior Publication Data

US 2004/0239662 A1 Dec. 2, 2004

(30) Foreign Application Priority Data

Apr. 18, 2003 (JP) ............................. 2003-113706

(51) Int. Cl.
*H03K 19/0175* (2006.01)

(52) U.S. Cl. .......................................... 326/83; 326/26

(58) Field of Classification Search ................... 326/26, 326/27, 82–87
See application file for complete search history.

(56) References Cited

U.S. PATENT DOCUMENTS 3,828,204 A * 8/1974 Farnsworth .................. 327/73
6,339,344 B1 * 1/2002 Sakata et al. .................. 326/83
6,459,306 B1 * 10/2002 Fischer et al. .................. 327/67
7,129,800 B2 * 10/2006 Gauthier et al. ............. 331/175
2002/0030509 A1 * 3/2002 Sakata et al. .................. 326/83

FOREIGN PATENT DOCUMENTS

JP 2001-156180 6/2001

* cited by examiner

*Primary Examiner*—Don P Le
(74) *Attorney, Agent, or Firm*—McGinn IP Law Group, PLLC

(57) ABSTRACT

A signal transmission circuit is formed by a transmitter, a receiver, a transmission line therebetween, and a bias circuit. The transmitter receives an input signal to transmit a signal corresponding to the input signal to the input of the transmission line. A voltage amplitude of the transmitted signal is smaller than a voltage amplitude defined by first and second power supply terminals. The receiver receives the transmitted signal, adjusts a voltage of the received signal in accordance with a bias voltage to generate a voltage adjusted signal, and wave-shapes the voltage adjusted signal to generate an output signal. The bias circuit differentially amplifies the output signal of the receiver and an inverted signal thereof to generate the bias voltage. The bias circuit includes a capacitor charged and discharged in accordance with the bias voltage.

12 Claims, 9 Drawing Sheets

SIMPLE SIGNAL TRANSMISSION CIRCUIT CAPABLE OF DECREASING POWER CONSUMPTION

BACKGROUND OF THE INVENTION

1. Field of the Invention

The present invention relates to a signal transmission circuit used between data line (or signal line) driver circuits of a display apparatus such as a liquid crystal display (LCD) apparatus.

2. Description of the Related Art

Recently, in an LCD apparatus, a plurality of driver circuits such as data line driver circuits formed by large scale integrated (LSI) circuits are mounted on a glass substrate of an LCD panel by a chips-on-glass (COG) process or a system-on-glass (SOG) process. In this case, the data line driver circuits are arranged by a cascade connection method using aluminum connections therebetween. Therefore, since the aluminum connections have large resistances, high speed signal transmission circuits are required.

A first prior art signal transmission circuit is constructed by a transmitter formed by a CMOS inverter, a receiver formed by a CMOS inverter, and a transmission line therebetween. This will be explained later in detail.

In the above-described first prior art signal transmission circuit, however, the higher the frequency of a transmitted signal, the larger the power consumption.

A second prior art signal transmission circuit uses a reduced swing differential signaling (RSDS) method in conformity with the interface standard of National Semiconductor Corp. This also will be explained later in detail.

In the above-described second prior art signal transmission circuit, however, the power consumption is still large. Also, since each signal transmission circuit requires two transmission lines, the signal transmission circuit is complex and large in scale.

A third prior art signal transmission circuit is constructed by precharging circuits for precharging the input and output, respectively, of a transmission line, in order to decrease the power consumption (see: JP-A-2001-156180). This also will be explained later in detail.

In the above-described third prior art signal transmission circuit, although the power consumption can be decreased, the precharging circuits are required, which would complicate and increase the circuit configuration in size.

SUMMARY OF THE INVENTION

It is an object of the present invention to provide a simple signal transmission circuit capable of decreasing the power consumption even if the frequency of a transmitted signal is higher than 200 MHz, for example.

According to the present invention, a signal transmission circuit is formed by a transmitter, a receiver, a transmission line therebetween, and a bias circuit. The transmitter receives an input signal to transmit a signal corresponding to the input signal to the input of the transmission line. A voltage amplitude of the transmitted signal is smaller than a voltage amplitude defined by first and second power supply terminals. The receiver receives the transmitted signal, adjusts a voltage of the received signal in accordance with a bias voltage to generate a voltage adjusted signal, and wave-shapes the voltage adjusted signal to generate an output signal. The bias circuit differentially amplifies the output signal of the receiver and an inverted signal thereof to generate the bias voltage. The bias circuit includes a capacitor charged and discharged in accordance with the bias voltage.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art signal transmission circuits will be explained with reference to FIGS. 1, 2, 3, 4 and 5.

Figure 1:
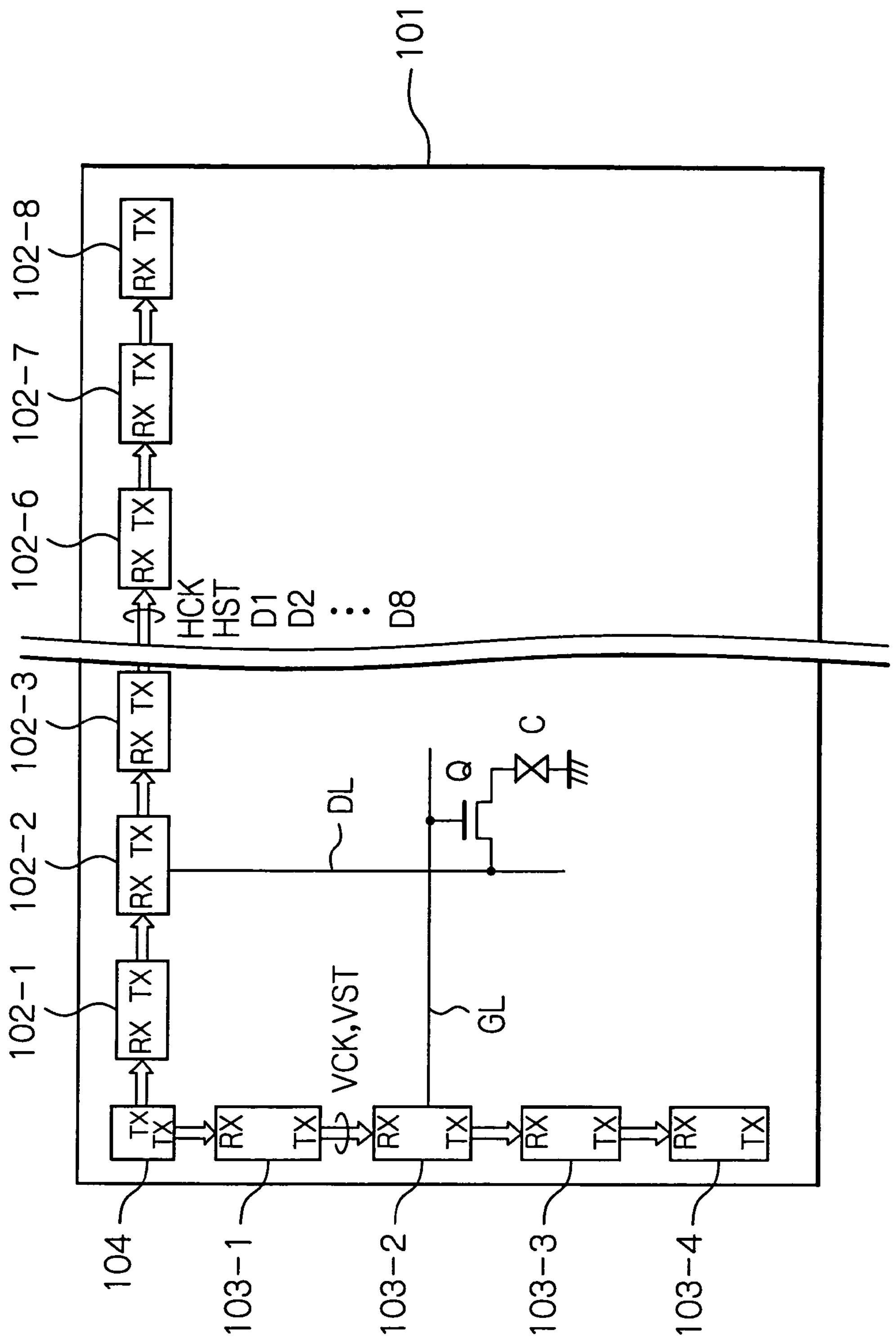
Fig. 1 PRIOR ART
FIG. 1 is a block circuit diagram illustrating a conventional LCD apparatus to which a signal transmission circuit is applied.

In FIG. 1, which illustrates a conventional LCD apparatus to which a signal transmission circuit is applied, reference numeral 101 designates an LCD panel having 1024×3×768 dots, for example. In this case, the LCD panel 101 includes 3072 (1024×3) data lines (or signal lines) DL and 768 gate lines (or scan lines) GL. One pixel, which is located at each intersection between the data lines DL and the gate lines GL, is constructed by one thin film transistor Q and one liquid crystal cell C.

In order to drive the 3072 data lines DL, eight data line driver circuits 102-1, 102-2, . . . , 102-8 formed by large scale integrated (LSI) circuits, each for driving the 384 data lines DL, are provided on a horizontal edge of the LCD panel 101. In this case, the data line driver circuits 102-1, 102-2, . . . , 102-8 are arranged by a cascade connection method to transmit a horizontal clock signal HCK, a horizontal start pulse signal HST, 8-bit digital data signals D1, D2, . . . , D8 and so on therethrough.

On the other hand, in order to drive the 768 gate lines GL, four gate line driver circuits 103-1, 103-2, 103-3 and 103-4 formed by LSIs are provided on a vertical edge of the LCD panel 101. In this case, the gate line driver circuits 103-1, 103-2, 103-3 and 103-4 are arranged by a cascade connection method to transmit a vertical clock signal VCK, a vertical start pulse signal VST and so on therethrough.

Also, a timing controller 4 formed by an LSI circuit is provided on the LCD panel 101 in proximity to the data line driver circuit 102-1 and the gate line driver circuit 103-1. In this case, the timing controller 104 generates the horizontal clock signal HCK, the horizontal start pulse signal HST, the data signals D1, D2, . . . , D8 and so on and transmits them to the data line driver circuit 102-1. Also, the timing controller 104 generates the vertical clock signal VCK, the vertical start pulse signal VST and so on and transmits them to the gate line driver circuit 103-1.

Recently, the data line driver circuits 102-1, 102-2, . . . , 102-8, the gate line driver circuits 103-1, 103-2, 103-3 and 103-4 and the timing controller 104 are mounted on the LCD panel 101 by a chips-on-glass (COG) process or a system-on-glass (SOG) process in order to decrease the manufacturing cost. In this case, transmission lines made of aluminum are formed on the LCD panel 101 between the data line driver circuits 102-1, 102-2, . . . , 102-8, the gate line driver circuits 103-1, 103-2, 103-3 and 103-4, and the timing controller 104.

Since the LCD apparatus of FIG. 1 is large in scale and high in precision, the above-mentioned transmission lines. particularly, the transmission lines between the data line driver circuits 102-1, 102-2, . . . , 102-8 need to be operated at high speed.

In FIG. 1, TX designates a transmitter circuit including a plurality of transmitters and RX designates a receiver circuit including a plurality of receivers. That is, one signal transmission circuit is constructed by one transmitter of the transmitter circuit TX, one receiver of the receiver circuit RX, and one transmission line therebetween.

Figure 2:
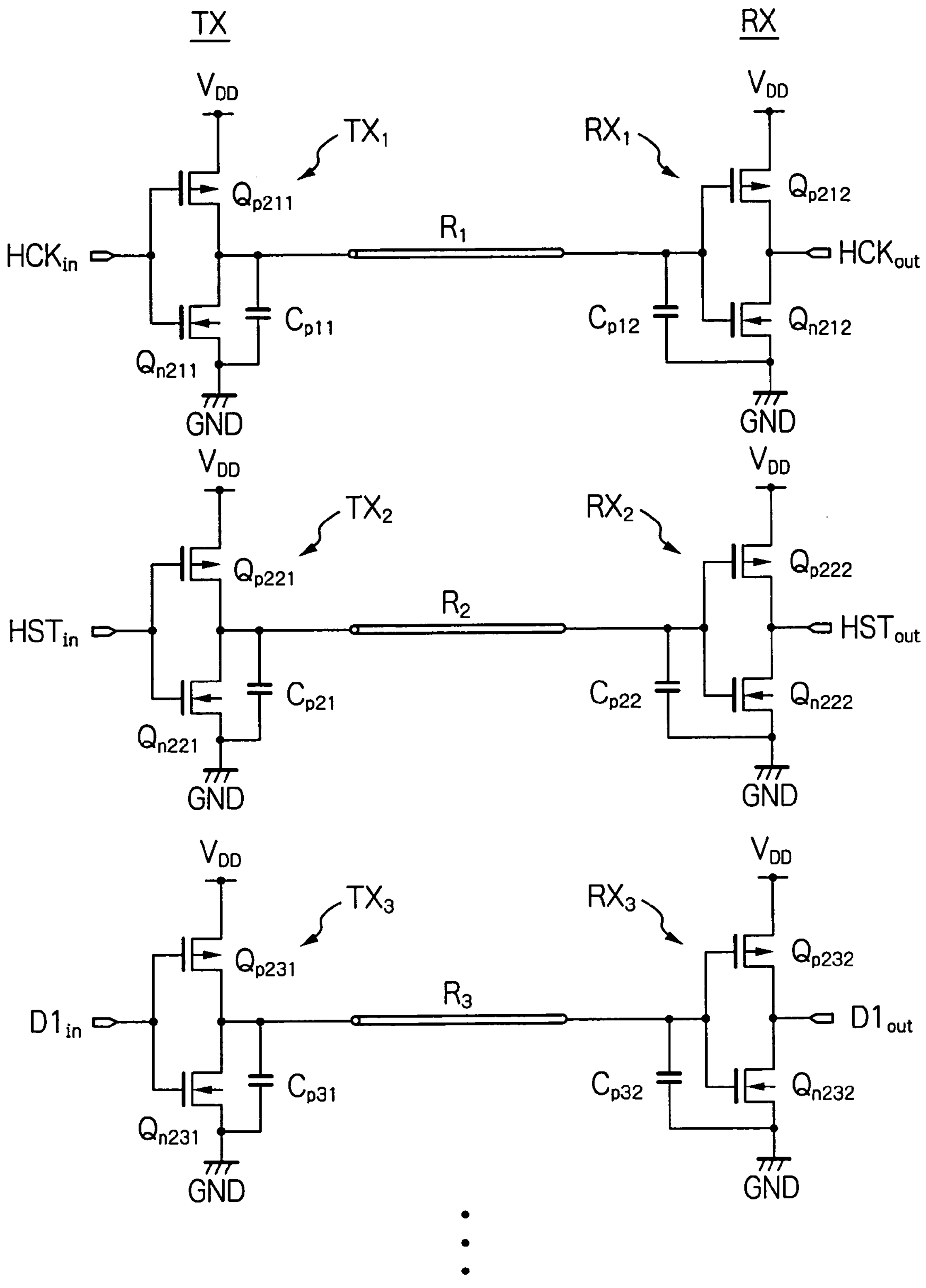
Fig. 2 PRIOR ART
FIG. 2 is a circuit diagram illustrating a first prior art signal transmission circuit.

In FIG. 2, which illustrates a first prior art signal transmission circuit, a transmitter $TX_1$ for receiving a horizontal clock signal $HCK_{in}$ is constructed by a CMOS inverter formed by a P-channel MOS transistor $Q_{p211}$ and an N-channel MOS transistor $Q_{n211}$, and a receiver $RX_1$ for receiving the horizontal clock signal $HCK_{in}$ to generate a horizontal clock signal $HCK_{out}$ is constructed by a CMOS inverter formed by a P-channel MOS transistor $Q_{P212}$ and an N-channel MOS transistor $Q_{n212}$. The transmitter $TX_1$ and the receiver $RX_1$ are connected by a transmission line having a resistance of $R_1$. Also, a transmitter $TX_2$ for a horizontal start pulse signal $HST_{in}$ is constructed by a CMOS inverter formed by a P-channel MOS transistor $Q_{p221}$ and an N-channel MOS transistor $Q_{n221}$, and a receiver $RX_2$ for receiving the horizontal start pulse signal $HST_{in}$ to generate a horizontal start pulse signal $HST_{out}$ is constructed by a CMOS inverter formed by a P-channel MOS transistor $Q_{p221}$ and an N-channel MOS transistor $Q_{n221}$. The transmitter $TX_2$ and the receiver $RX_2$ are connected by a transmission line having a resistance of $R_2$. Further, a transmitter $TX_3$ for receiving digital data $D\mathbf{1}_{in}$ is constructed by a CMOS inverter formed by a P-channel MOS transistor $Q_{n231}$ and an N-channel MOS transistor $Q_{n231}$, and a receiver $RX_3$ for receiving the digital data $D\mathbf{1}_{in}$ to generate digital data $D\mathbf{1}_{out}$ is constructed by a CMOS inverter formed by a P-channel MOS transistor $Q_{p232}$ and an N-channel MOS transistor $Q_{n232}$. The transmitter $TX_3$ and the receiver $RX_3$ are connected by a transmission line having a resistance of $R_3$.

In FIG. 2, $C_{p11}$, $C_{p21}$, $p_{31}$, . . . are output parasitic capacitances of the transmitters $TX_1$, $TX_2$, $TX_3$, . . . , respectively, whose values are about 3 to 4 pF, and $C_{p12}$, $C_{p22}$, $C_{p32}$, . . . are input parasitic capacitances of the receivers $RX_1$, $RX_2$, $RX_3$, . . . , respectively, whose values are about 3 to 4 pF.

Similar transmitters, receivers and transmission lines are provided for digital data D2, D3, . . . , D8 and so on.

For example, in the transmitter $TX_1$ when the horizontal clock signal HCK is low (=GND), the transistors $Q_{p211}$ and $Q_{n211}$ are turned ON and OFF, respectively, so that the output voltage is high (=$V_{DD}$). As a result, in the receiver $RX_1$, the input voltage is high (=$V_{DD}$) so that the transistors $Q_{p221}$ and $Q_{n221}$ are turned OFF and ON, respectively. Thus, the output voltage of the receiver $RX_1$ is high (=$V_{DD}$).

On the other hand, in the transmitter $TX_1$, when the horizontal clock signal HCK is high (=$V_{DD}$), the transistors $Q_{p211}$ and $Q_{n211}$ are turned OFF and ON, respectively, so that the output voltage is low (=GND). As a result, in the receiver $RX_1$, the input voltage is low (=GND) so that the transistors $Q_{p221}$ and $Q_{n221}$ are turned OFF and ON, respectively. Thus, the output voltage of the receiver $RX_1$ is low (=GND).

The horizontal clock signal HCK supplied to the input of the transmitter $TX_1$ is transmitted via the transmission line ($R_1$) to the output of the receiver $RX_1$.

Generally, the power consumption $P(TX_1)$ of the transmitter $TX_1$ is represented by $$P(TX_1) \propto f \cdot C_{p11} \cdot VDD^2$$

where f is the frequency of the horizontal clock signal $HCK_{in}$.

Also the power consumption $P(RX_1)$ of the receiver $RX_1$ is represented by $$P(RX_1) \propto f \cdot C_{P12} \cdot VDD^2$$

Therefore, the higher the frequency f of the horizontal clock signal HCK, the larger the power consumption.

Thus, in FIG. 2, the higher the frequencies of the signals HCK, HST, D1, . . . , the higher the power consumption. Also, the transmitted signals are blunted by a time constant determined by the transmission line such as $R_1$ whose value is several hundreds of Ω as well as the output and input parasitic capacitances such as $C_{p11}$ and $C_{p12}$ whose values are about 3 to 4 pF.

Figure 3:
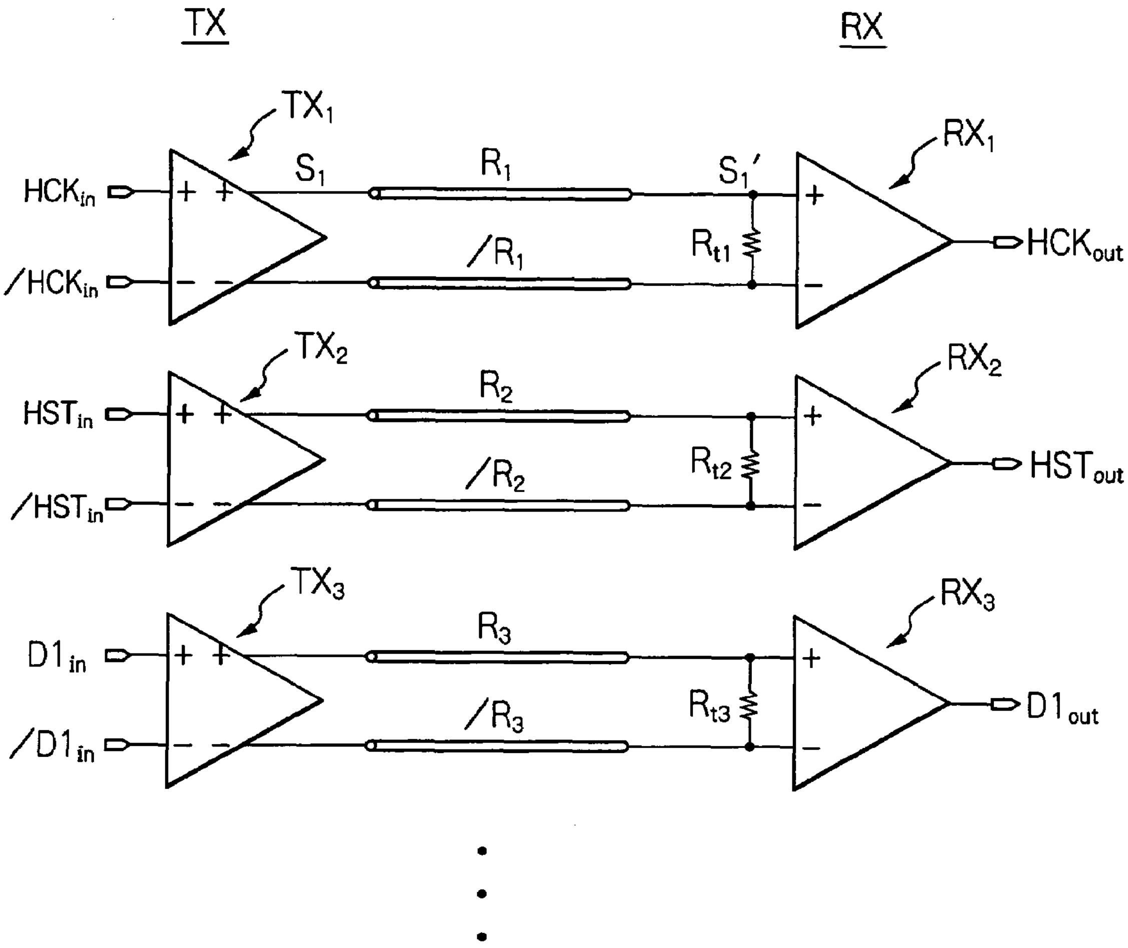
Fig. 3 PRIOR ART
FIG. 3 is a circuit diagram illustrating a second prior art signal transmission circuit.

In FIG. 3, which illustrates a second prior art signal transmission circuit, this signal transmission circuit uses a reduced swing differential signaling (RSDS) method in conformity with the interface standard of National Semiconductor Inc. A transmitter $TX_1$ for receiving a horizontal clock signal $HCK_{in}$ and its inverted signal $/HCK_{in}$ is constructedby a differential amplifier which generates two complemental output signals, and a receiver $RX_1$ for generating a horizontal clock signal $HCK_{out}$ is constructed by a voltage comparator which compares the voltage of one of the complemental output signals of the transmitter $TX_1$ with that of the other. The transmitter $TX_1$ and the receiver $RX_1$ are connected by two transmission lines having resistances $R_1$ and $/R_1$, respectively, with a terminal resistor $R_{t1}$. Also, a transmitter $TX_2$ for receiving a horizontal start pulse signal $HST_{in}$ and its inverted signal $/HST_{in}$ is constructed by a differential amplifier which generates two complementary output signals, and a receiver $RX_2$ for generating a horizontal start pulse signal $HST_{out}$ is constructed by a voltage comparator which compares the voltage of one of the complementary output signals of the transmitter $TX_2$ with that of the other. The transmitter $TX_2$ and the receiver $RX_2$ are connected by two transmission lines having resistances $R_2$ and $/R_2$, respectively, with a terminal resistor $R_{t2}$. Further, a transmitter $TX_3$ for receiving digital data $D\mathbf{1}_{in}$ and its inverted signal $/D\mathbf{1}_{in}$ is constructed by a differential amplifier which generates two complementary output signals, and a receiver $RX_3$ for generating digital data $D\mathbf{1}_{out}$ is constructed by a voltage comparator which compares the voltage of one of the complementary output signals of the transmitter $TX_3$ with that of the other. The transmitter $TX_3$ and the receiver $RX_3$ are connected by two transmission lines having resistances $R_3$ and $/R_3$, respectively, with a terminal resistor $R_{t3}$.

Similar transmitters, receivers and transmission lines with terminal resistors are provided for digital data D2, D3, . . . , D8 and so on.

Figure 4:
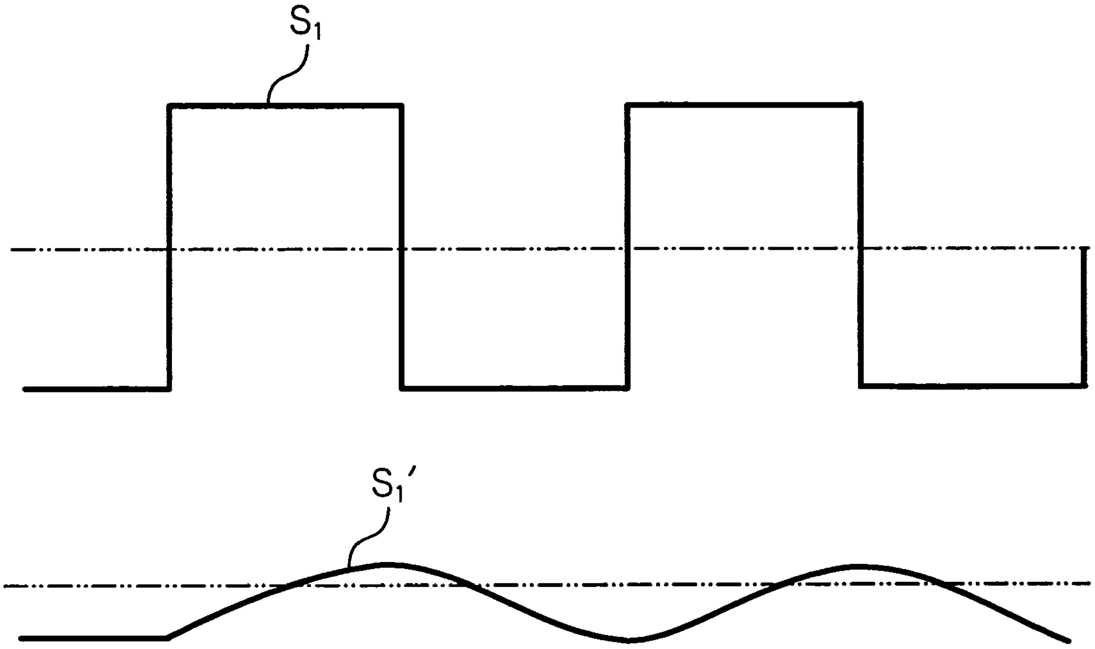
Fig. 4 PRIOR ART
FIG. 4 is a timing diagram for explaining the operation of the circuit of FIG. 3.

For example, as shown in FIG. 4, when one output signal $S_1$ of the transmitter $TX_1$ is changed, one input signal $S_1'$ of the receiver $RX_1$ is blunted by a time constant determined by the transmission line ($R_1$) and the terminal resistor $R_{t1}$ as well as output and input parasitic capacitances (not shown). Therefore, when the frequency of the clock signal $HCK_{in}$ is very high, the input signal $S_1$' cannot reach a high level.

Also, in FIG. 3, since each of the transmitters $TX_1$, $TX_2$, $TX_3$, . . . requires a current of 2.0 mA and each of the receivers $RX_1$, $RX_2$, $RX_3$, . . . requires a current of several hundreds of μA, the power consumption is still large.

Further, since each signal transmission circuit requires two transmission lines, the signal transmission circuit is complex and large in scale.

Figure 5:
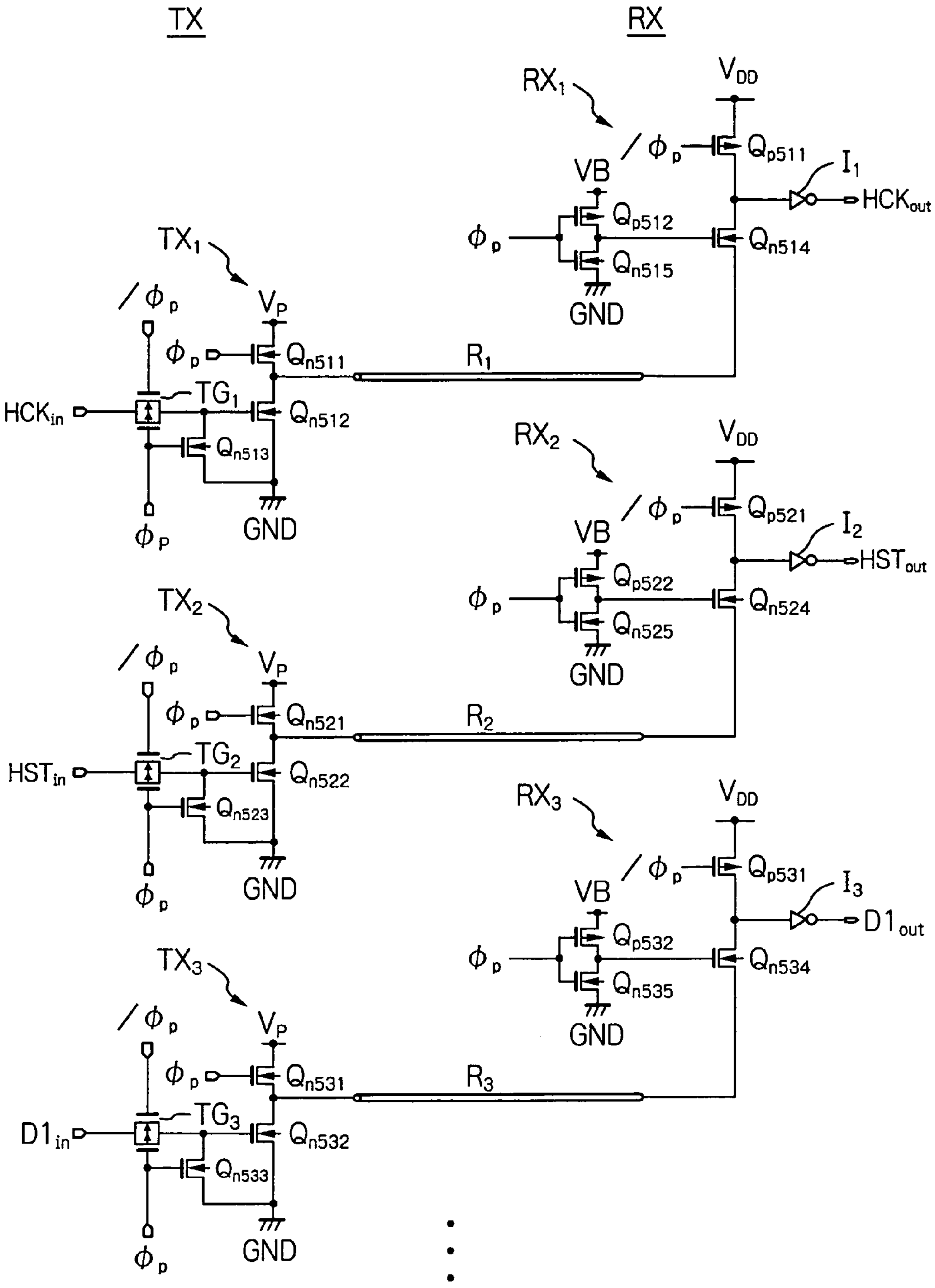
Fig. 5 PRIOR ART
FIG. 5 is a circuit diagram illustrating a third prior art signal transmission circuit.

In FIG. 5, which illustrates a third prior art signal transmission circuit (see: JP-A-2001-156180), a transmitter $TX_1$ for receiving a horizontal clock signal $HCK_{in}$ is constructed by a transfer gate $TG_1$ clocked by clock signals $\phi_p$ and $/\phi_p$, a precharging N-channel MOS transistor $Q_{n511}$ powered by a voltage $V_p$ and clocked by the clock signal $\phi_p$, and N-channel MOS transistors $Q_{n512}$ and $Q_{n513}$, and a receiver $RX_1$ for receiving the horizontal clock signal $HCK_{in}$ to generate a horizontal clock signal $HCK_{out}$ is constructed by a precharging P-channel MOS transistor $Q_{n511}$ powered by a power supply voltage $V_{DD}$ and clocked by the clock signal $/\phi_p$, an N-channel MOS transistor $Q_{n514}$, a bias circuit formed by a P-channel MOS transistor $Q_{n514}$ and an N-channel MOS transistor $Q_{n515}$ powered by a bias voltage VB and the ground voltage GND clocked by the clock signal $\phi_p$, and an inverter $I_1$. The transmitter $TX_1$ and the receiver $RX_1$ are connected by a transmission line having a resistance of $R_1$. Also, a transmitter $TX_2$ for receiving a horizontal start pulse signal HST is constructed by a transfer gate $TG_2$ clocked by clock signals $\phi_p$ and $/\phi_p$, a precharging N-channel MOS transistor $Q_{n521}$ powered by the voltage $V_p$ and clocked by the clock signal $\phi_p$, and N-channel MOS transistors $Q_{n522}$ and $Q_{n523}$, and a receiver $RX_2$ for receiving the horizontal start pulse signal $HST_{in}$ to generate a horizontal start pulse signal $HST_{out}$ is constructed by a precharging P-channel MOS transistor $Q_{p521}$ powered by the power supply voltage $V_{DD}$ and clocked by the clock signal $/\phi_p$, an N-channel MOS transistor $Q_{n524}$, a bias circuit formed by a P-channel MOS transistor $Q_{p522}$ and an N-channel MOS transistor $Q_{n525}$ powered by the bias voltage VB and the ground voltage GND clocked by the clock signal $\phi_p$, and an inverter $I_2$. The transmitter $TX_2$ and the receiver $RX_2$ are connected by a transmission line having a resistance of $R_2$. Further, a transmitter $TX_3$ for receiving digital data $D\mathbf{1}_{in}$ is constructed by a transfer gate $TG_3$ clocked by clock signals $\phi_p$ and $/\phi_p$, a precharging N-channel MOS transistor $Q_{n531}$ powered by the voltage $V_p$ and clocked by the clock signal $\phi_p$, and N-channel MOS transistors $Q_{n532}$ and $Q_{n533}$, and a receiver $RX_3$ for receiving the digital data $D\mathbf{1}_{in}$ to generate digital data $D\mathbf{1}_{out}$ is constructed by a precharging P-channel MOS transistor $Q_{n531}$ powered by the power supply voltage $V_{DD}$ and clocked by the clock signal $/\phi_p$, an N-channel MOS transistor $Q_{n534}$, a bias circuit formed by a P-channel MOS transistor $Q_{p532}$ and an N-channel MOS transistor $Q_{n535}$ powered by the bias voltage VB and the ground voltage GND clocked by the clock signal $\phi_p$, and an inverter $I_3$. The transmitter $TX_3$ and the receiver $RX_3$ are connected by a transmission line having a resistance of $R_3$.

Similar transmitters, receivers and transmission lines are provided for digital data D2, D3, . . . , D8 and so on.

The operation of the transmitter $TX_1$ and the receiver $RX_1$ is explained next.

During a precharging period, the clock signals $\phi_p$ and $/\phi_p$ are high and low, respectively. Therefore, in the transmitter $TX_1$, the transfer gate $TG_1$ is closed and the transistor $Q_{n513}$ is turned ON, so that the transistor $Q_{n512}$ is turned OFF. Also, the precharging transistor $Q_{n511}$ is turned ON. As a result, the input of the transmission line ($R_1$) is charged to $V_p$. On the other hand, in the receiver $RX_1$, the transistors $Q_{p512}$ and $Q_{n515}$ are turned ON and OFF, respectively, to turn OFF the transistor $Q_{514}$. Also, the precharging transistor $Q_{p511}$ is turned ON. As a result, the input of the inverter $I_1$ is charged to $V_{DD}$, so that the output signal $HCK_{out}$ of the inverter $I_1$ is low.

When the control enters a transmission period where the horizontal clock signal $HCK_{in}$ is high, the clock signals $\phi_p$ and $/\phi_p$ are low and high, respectively. Therefore, in the transmitter $TX_1$, the transfer gate $TG_1$ is opened and the transistor $Q_{n513}$ is turned OFF, so that the transistor $Q_{n512}$ is turned ON by the horizontal clock signal $HCK_{in}$ passed through the transfer gate $TG_1$. Also, the precharging transistor $Q_{n511}$ is turned OFF. As a result, the voltage at the input of the transmission line ($R_1$) is decreased, so that the voltage at the output of the transmission line ($R_1$) is decreased. On the other hand, in the receiver $RX_1$, the transistors $Q_{p512}$ and $Q_{p515}$ are turned OFF and ON, respectively, so that the gate voltage of the transistor $Q_{n514}$ is biased at VB. Also, the precharging transistor $Q_{p311}$ is turned OFF. As a result, the input of the inverter $I_1$ is discharged through the biased transistor $Qn_{n514}$ to invert the output signal $HCK_{out}$ of the inverter $I_1$ from low to high. Contrary to the above, when the control enters a transmission period where the horizontal clock signal HCK is low, the clock signals $\phi_p$ and $/\phi_p$ are low and high, respectively. Therefore, in the transmitter $TX_1$, the transfer gate $TG_1$ is opened and the transistor $Q_{n513}$ is turned OFF, so that the transistor $Q_{n512}$ remains in an OFF state by the horizontal clock signal $HCK_{in}$ passed through the transfer gate $TG_1$. Also, the precharging transistor $Q_{n511}$ is turned OFF. As a result, the voltage at the input of the transmission line ($R_1$) is not decreased, so that the voltage at the output of the transmission line ($R_1$) is not decreased. On the other hand, in the receiver $RX_1$, the transistors $Q_{p512}$ and $Q_{n515}$ are turned ON and OFF, respectively, so that the gate voltage of the transistor $Q_{n514}$ is biased at GND. Also, the precharging transistor $Q_{p511}$ is turned OFF. As a result, the input of the inverter $I_1$ is not discharged through the biased transistor $Q_{n314}$ so that the output signal $HCK_{out}$ of the inverter $I_1$ remains low.

Thus, in the signal transmission circuit of FIG. 5, since currents flow when transmitting a high level signal but currents hardly flow when transmitting a low level signal, the power consumption can be decreased.

In the signal transmission circuit of FIG. 5, however, since the precharging circuits formed by the transistors $Q_{n511}$ and $Q_{n511}$, and the bias circuit ($Q_{p512}$, $Q_{n515}$) are required, the control circuit (not shown) therefor is complex. Also, when the output signal of the transmitter such as $TX_1$ is low, the input signal of the receiver such as $RX_1$ is blunted by a time constant determined by the transmission line ($R_1$) as well as output and input parasitic capacitances (not shown).

Figure 6:
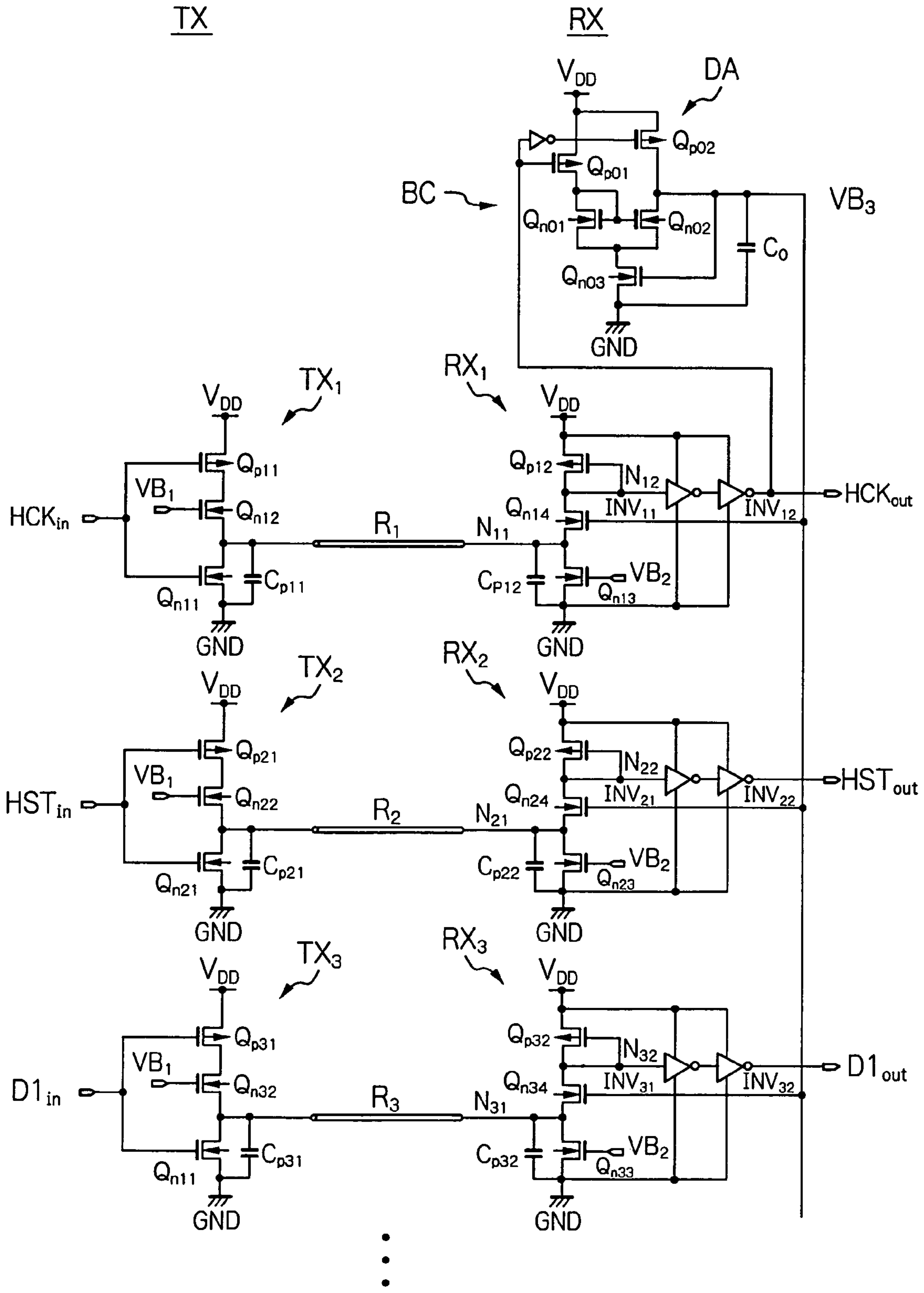
FIG. 6 is a circuit diagram illustrating a first embodiment of the signal transmission circuit according to the present invention.

In FIG. 6, which illustrates a first embodiment of the signal transmission circuit according to the present invention, a transmitter $TX_1$ for receiving a horizontal clock signal $HCK_{in}$ is constructed by a CMOS inverter formed by a P-channel MOS transistor $Q_{p11}$ and an N-channel MOS transistor $Q_{n11}$ and a voltage amplitude limiting N-channel MOS transistor $Q_{n12}$ connected between the transistors $Q_{p11}$ and $Q_{n11}$. In this case, a definite bias voltage $VB_1$ is applied to the gate of the transistor $Q_{n12}$ to limit a high level of an output signal. For example, the high level of the output signal is limited by about 1V lower than a power. supply voltage VDD such as 2.5V. Also, a receiver $RX_1$ for receiving the horizontal clock signal $HCK_{in}$ to generate a horizontal clock signal $HCK_{out}$ is constructed by a load drain-gate connected P-channel MOS transistor $Q_{p12}$, a constant current source formed by an N-channel MOS transistor $Q_{n13}$ whose gate receives a definite bias voltage $VB_2$, and a voltage adjusting N-channel MOS transistor $Q_{n14}$ whose gate receives a variable bias voltage $VB_3$. The voltage adjusting N-channel MOS transistor $Q_{n14}$ adjusts the voltage at node $N_{11}$ to generate an adjusted voltage at node $N_{n12}$. In this case, the higher the bias voltage $VB_3$, the higher the voltage at node $N_{12}$. Also, the transistors $Q_{p12}$, $Q_{n14}$ and $Q_{n13}$ entirely serve as a current limiting means. The voltage at node $N_{12}$ is supplied to an inverter $INV_{11}$ for wave-shaping the voltage at node $N_{12}$, and is inverted by an inverter $INV_{12}$. In this case, since the inverter $INV_{11}$ has a threshold voltage such as 0.2V, the voltage at node $N_{12}$ is changed to a high level signal (=$V_{DD}$) or a low level signal (=GND) in accordance with whether or not the voltage at node $N_{12}$ is higher than the threshold voltage. The transmitter $TX_1$ and the receiver $RX_1$ are connected by a transmission line having a resistance of $R_1$ whose value is hundreds of Ω.

Also, a transmitter $TX_2$ for receiving a horizontal start pulse signal $HST_{in}$ is constructed by a CMOS inverter formed by a P-channel MOS transistor $Q_{p21}$ and an N-channel MOS transistor $Q_{n21}$ and a voltage amplitude limiting N-channel MOS transistor $Q_{n22}$ connected between the transistors $Q_{p21}$ and $Q_{n21}$. In this case, the definite bias voltage $VB_1$ is applied to the gate of the transistor $Q_{n22}$ to limit a high level of an output signal. For example, the high level of the output signal is limited by about 1V lower than a power supply voltage $V_{DD}$ such as 2.5V. Also, a receiver $RX_2$ for receiving the horizontal start pulse signal $HST_{in}$ to generate a horizontal clock signal $HST_{out}$ is constructed by a load drain-gate connected P-channel MOS transistor $Q_{p22}$, a constant current source formed by an N-channel MOS transistor $Q_{n23}$ whose gate receives the definite bias voltage $VB_2$, and a voltage adjusting N-channel MOS transistor $Q_{n24}$ whose gate receives the variable bias voltage $VB_3$. The voltage adjusting N-channel MOS transistor $Q_{n24}$ adjusts the voltage at node $N_{21}$ to generate an adjusted voltage at node $N_{22}$. In this case, the higher the bias voltage $VB_3$, the higher the voltage at node $N_{22}$. Also, the transistors $Q_{p22}$, $Q_{n24}$ and $Q_{n23}$ entirely serve as a current limiting means. The voltage at node $N_{22}$ is supplied to an inverter $INV_{21}$ for wave-shaping the voltage at node $N_{22}$, and is inverted by an inverter $INV_{22}$. In this case, since the inverter $INV_{21}$ has a threshold voltage such as 0.2V, the voltage at node $N_{22}$ is changed to a high level signal (=$V_{DD}$) or a low level signal (=GND) in accordance with whether or not the voltage at node $N_{22}$ is higher than the threshold voltage. The transmitter $TX_2$ and the receiver $RX_2$ are connected by a transmission line having a resistance of $R_2$ whose value is hundreds of Ω.

Further, a transmitter $TX_3$ for receiving digital data $D\mathbf{1}_{in}$ is constructed by a CMOS inverter formed by a P-channel MOS transistor $Q_{p31}$ and an N-channel MOS transistor $Q_{n31}$ and a voltage amplitude limiting N-channel MOS transistor $Q_{n32}$ connected between the transistors $Q_{p31}$, and $Q_{n31}$. In this case, the definite bias voltage $VB_1$ is applied to the gate of the transistor $Q_{n32}$ to limit a high level of an output signal. For example, the high level of the output signal is limited by about 1V lower than a power supply voltage $V_{DD}$ such as 2.5V. Also, a receiver $RX_3$ for receiving the digital data $D\mathbf{1}_{in}$ to generate digital data $D\mathbf{1}_{out}$ is constructed by a load drain-gate connected P-channel MOS transistor $Q_{p32}$, a constant current source formed by a N-channel MOS transistor $Q_{n33}$ whose gate receives the definite bias voltage $VB_2$, and a voltage adjusting N-channel MOS transistor $Q_{n34}$ whose gate receives the variable bias voltage $VB_3$. The voltage adjusting N-channel MOS transistor $Q_{n34}$ adjusts the voltage at node $N_{31}$ to generate an adjusted voltage at node $N_{32}$. In this case, the higher the bias voltage $VB_3$, the higher the voltage at node $N_{32}$. Also, the transistors $Q_{p32}$, $Q_{n34}$ and $Q_{n33}$ entirely serve as a current limiting means. The voltage at node $N_{32}$ is supplied to an inverter $INV_{31}$ for wave-shaping the voltage at node $N_{32}$, and is inverted by an inverter $INV_{32}$. In this case, since the inverter $INV_{31}$ has a threshold voltage such as 0.2V, the voltage at node $N_{12}$ is changed to a high level signal (=$V_{DD}$) or a low level signal (=GND) in accordance with whether or not the voltage at node $N_{32}$ is higher than the threshold voltage. The transmitter $TX_3$ and the receiver $RX_3$ are connected by a transmission line having a resistance of $R_3$ whose value is hundreds of Ω.

Similar transmitters, receivers and transmission lines are provided for digital data D2, D3, . . . , D8 and so on.

A bias circuit BC receives the horizontal clock signal $HCK_{out}$ from the receiver $RX_1$ and transmits the bias voltage $VB_3$ to the gates of the voltage adjusting transistors $Q_{n14}$, $Q_{n24}$, $Q_{n34}$, . . . , of the receivers $RX_1$, $RX_2$, $RX_3$, . . . .

The bias circuit BC is constructedby a differential amplifier DA for differentially amplifying the horizontal clock signal $HCK_{out}$ and its inverted signal, and a capacitor $C_o$ charged and discharged by the differential amplifier DA. The differential amplifier DA is formed by a differential pair including P-channel MOS transistors $Q_{p01}$ and $Q_{p02}$ controlled by the horizontal clock signal $HCK_{out}$ and its inverted signal, respectively, a current mirror circuit formed by N-channel MOS transistors $Q_{n01}$ and $Q_{n02}$, and a switch formed by an N-channel MOS transistor $Q_{n03}$. Note that the transistors $Q_{p01}$ and $Q_{p02}$ have the same dimension, and the transistors $Q_{n0}$ and $Q_{n1}$ have the same dimension, in order to respond to the horizontal clock signal $HCK_{out}$ which has a 50% duty ratio. Also, the transistor $Q_{n03}$ is controlled by the bias voltage $VB_3$, in order to prevent the receiver $RX_1$ from self-oscillating.

Figure 7:
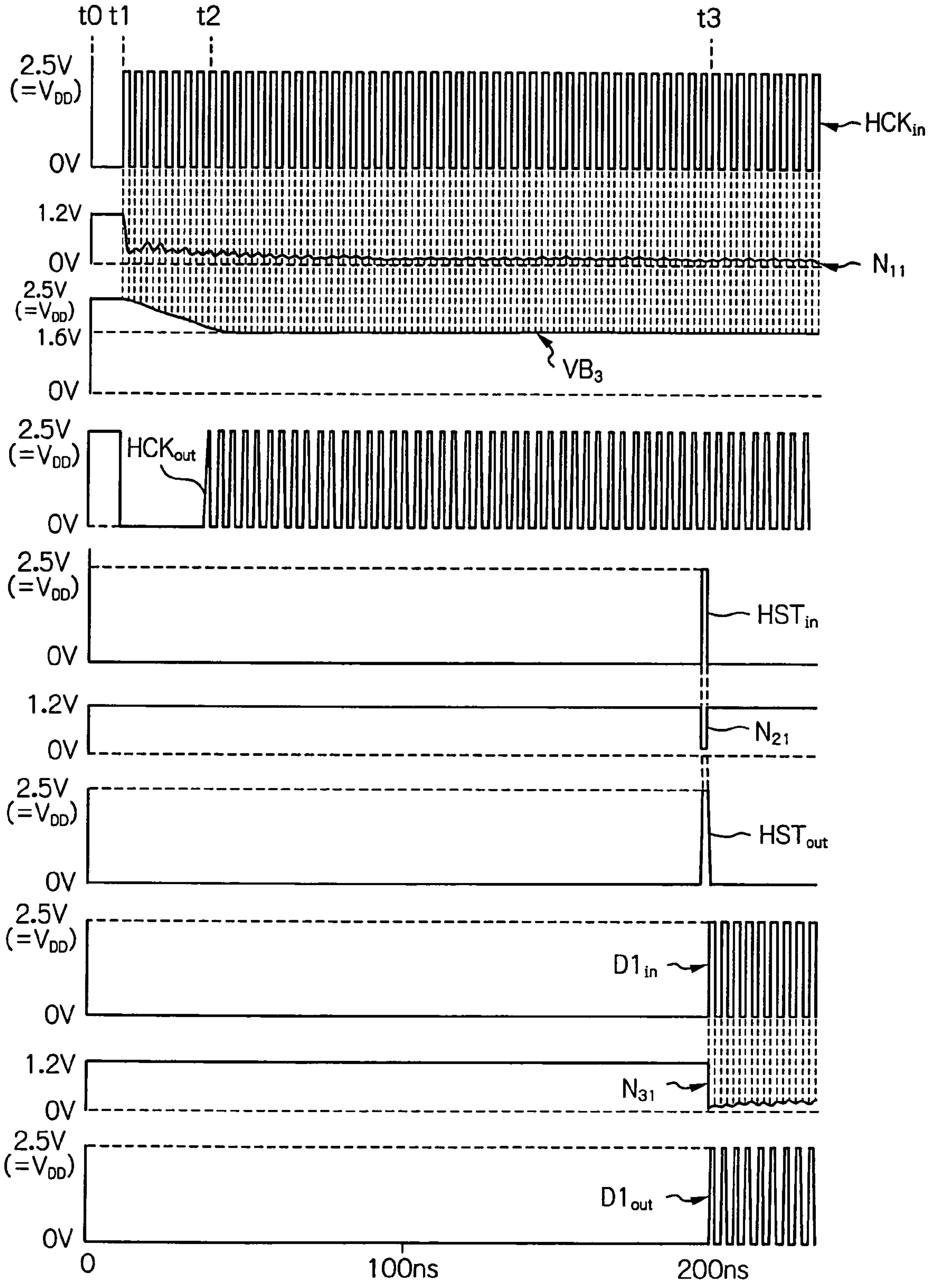
FIG. 7 is a timing diagram for explaining the operation of the circuit of FIG. 6.

The operation of the signal transmission circuit of FIG. 6 is explained next with reference to FIG. 7, where $V_{DD}$ is 2.5V, the frequency of the horizontal clock signal HCK is 250 $MH_z$, and the resistances $R_1$, $R_2$, $R_3$, . . . are 100Ω.

First, at time t0, in the transmitter $TX_1$, when the horizontal clock signal $HCK_{in}$ is low (=GND), the transistors $Q_{p11}$ and $Q_{n11}$ are turned ON and OFF, respectively, so that the output voltage is high (=$VB_1-V_{GS}$, where $V_{GS}$ is a gate-to-source voltage of the transistor $Q_{n12}$). For example, if $VB_1$ is 2.0V and $V_{GS}$ is 0.8V, $VB_1-V_{GS}$=1.2V. As a result, in the receiver $RX_1$, the voltage at node $N_{11}$ is high (=1.2V). In this case, since the voltage at node $N_{12}$ is sufficiently higher than the threshold voltage (=0.2V) of the inverter $INV_{11}$, the horizontal clock signal $HCK_{out}$ is high (=$V_{DD}$). Therefore, in the bias circuit BC, the transistors $Q_{p01}$ and $Q_{p02}$ are turned OFF and ON, respectively, the capacitor $C_0$ is charged to $V_{DD}$, so that the bias voltage $VB_3$ is high (=$V_{DD}$).

Next, at time t1, the horizontal clock signal $HCK_{in}$ is supplied to the transmitter $TX_1$. As a result, in the receiver $RX_1$, the voltage at node $N_{11}$ is rapidly decreased, so that the voltage at node $N_{12}$ may become lower than the threshold voltage (=0.2V) of the inverter $INV_{11}$. Thus, the horizontal clock signal $HCK_{out}$ is low (=0V). Therefore, in the bias circuit BC, the transistors $Q_{p01}$ and $Q_{p02}$ are turned ON and OFF, respectively, the capacitor $C_0$ is gradually discharged, so that the bias voltage $VB_3$ is gradually decreased.

When the bias voltage $VB_3$ is gradually decreased, the voltage at node $N_{11}$ is adjusted by the transistor $Q_{n14}$ to increase the voltage at node $N_{12}$ Finally, at time t2, the voltage at node $N_{12}$ reaches the threshold voltage (=0.2V) of the inverter $INV_{11}$, so that the bias voltage $VB_3$ is converged to a definite value such as 1.6V.

Next, at time t3 when a period of time has sufficiently lapsed after time t2, a horizontal start pulse signal $HST_{in}$, digital data $D1_{in}$ and so on are supplied to the transmitters $TX_2$, $TX_3$, . . . . As a result, since the bias voltage $VB_3$ is supplied commonly to the receivers $RX_2$, $RX_3$, . . . , the voltages at nodes $N_{21}$, $N_{31}$, . . . are immediately changed, so that a horizontal clock signal $HST_{out}$, digital data $D1_{out}$ and so on can be optimally regenerated or received.

In FIG. 6, since the bias voltage $VB_3$ is optimally supplied to the receivers $RX_1$, $RX_2$, $RX_3$, . . . , the transmission of signals can be at a higher frequency than 200 MHz. Also, since each of the transmitters $TX_1$, $TX_2$, $TX_3$, . . . has a voltage amplitude limiting function, the power consumption therein can be decreased. Note that this power consumption is in proportion to the squared voltage amplitude. Further, since each of the receivers $RX_1$, $RX_2$, $RX_3$, . . . has a current limiting function and a voltage adjusting function, the power consumption therein can be decreased. Note that this power consumption is in proportion to the current and the squared voltage amplitude. Additionally, since the transistors $Q_{p112}$ and $Q_{n14}$ of the receiver such as $RX_1$ serve as a current limiting means (several kΩ), when the transistor $Q_{n11}$ is turned ON, a current flowing through the transmission line ($R_1$) is very small (about 1 mA), which also would decrease the power consumption.

Additionally, since the bias voltage $VB_3$ derived from a steady signal, i.e., the horizontal clock signal $HCK_{out}$ is supplied to all the receivers $RX_1$, $RX_2$, $RX_3$, . . . , a non-steady signal such as a horizontal start pulse signal HST can be optimally received at a high frequency. Also, if the relative errors of the transmission lines ($R_1$, $R_2$, $R_3$, . . . ) are small, a wide operation range can be obtained even when the absolute errors of the transmission lines ($R_1$, $R_2$, $R_3$, . . . ) are large.

Figure 8:
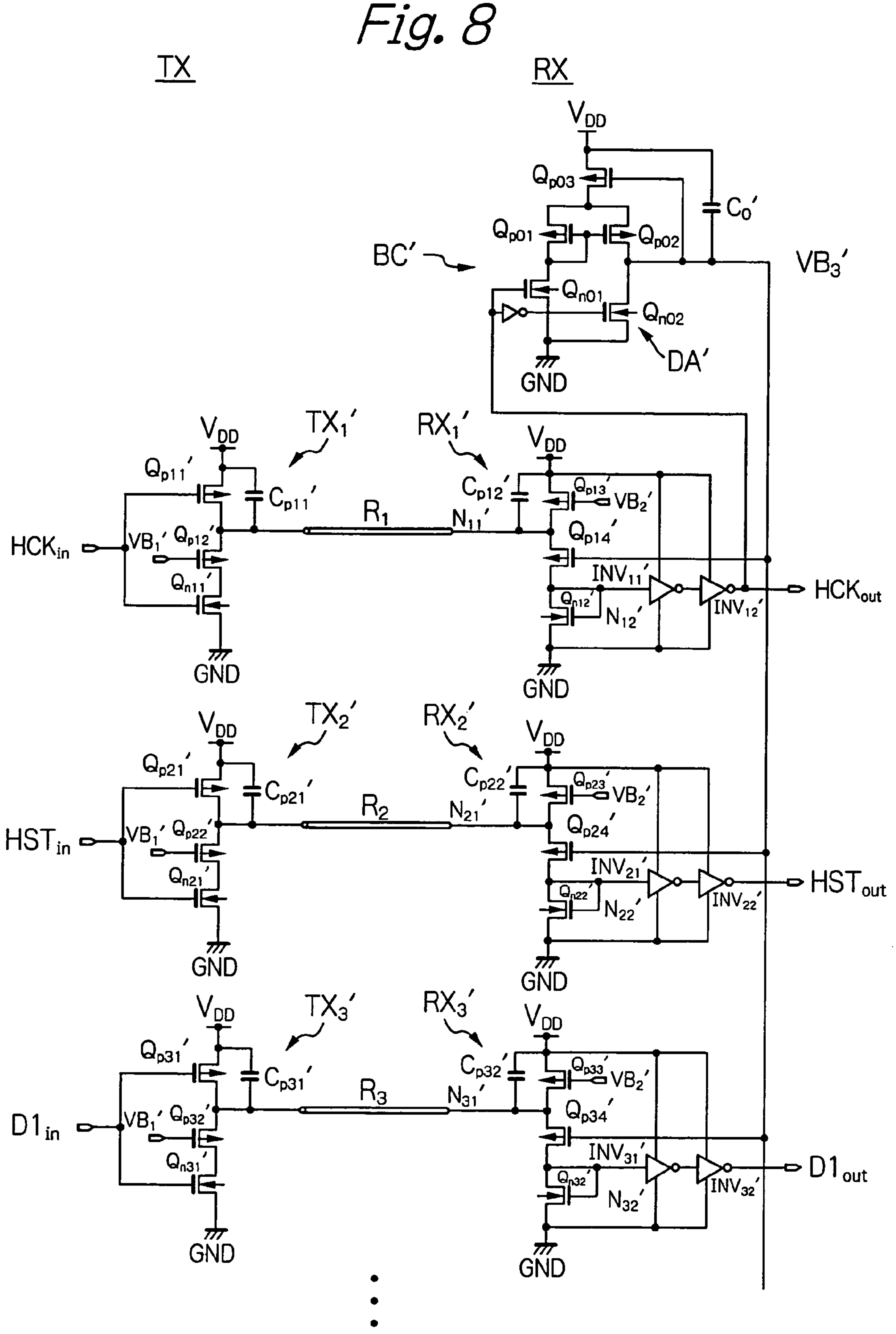
FIG. 8 is a circuit diagram illustrating a second embodiment of the signal transmission circuit according to the present invention.

In FIG. 8, which illustrates a second embodiment of the signal transmission circuit according to the present invention, a transmitter $TX_1'$ for receiving a horizontal clock signal $HCK_{in}$ is constructed by a CMOS inverter formed by a P-channel MOS transistor $Q_{p11}'$ and an N-channel MOS transistor $Q_{n11}'$ and a voltage amplitude limiting P-channel MOS transistor $Q_{p12}'$ connected between the transistors $Q_{p11}'$ and $Q_{n11}'$. In this case, a definite bias voltage $VB_1'$ is applied to the gate of the transistor $Q_{p12}'$ to limit a low level of an output signal. For example, the low level of the output signal is limited by about 1.5V higher than a ground voltage GND such as 0V. Also, a receiver $RX_1'$ for receiving the horizontal clock signal $HCK_{in}$ to generate a horizontal clock signal $HCK_{out}$ is constructed by a load drain-gate connected N-channel MOS transistor $Q_{n12}'$, a constant current source formed by a P-channel MOS transistor $Q_{13}'$ whose gate receives a definite bias voltage $VB_2'$, and a voltage adjusting P-channel MOS transistor $Q_{p14}'$ whose gate receives a variable bias voltage $VB_3'$. The voltage adjusting P-channel MOS transistor $Q_{p14}'$ adjusts the voltage at node $N_{11}'$ to generate an adjusted voltage at node $N_{12}'$. In this case, the lower the bias voltage $VB_3'$, the higher the voltage at node $N_{12}'$. Also, the transistors $Q_{n12}'$, $Q_{p14}'$ and $Q_{p13}'$ entirely serve as a current limiting means. The voltage at node $N_{12}'$ is supplied to an inverter $INV_{11}'$ for wave-shaping the voltage at node $N_{12}'$ and is inverted by an inverter $INV_{12}'$. In this case, since the inverter $INV_{11}'$ has a threshold voltage such as 2.3V, the voltage at node $N_{12}'$ is changed to a low level signal (=GND) or a low level signal (=$V_{DD}$) in accordance with whether or not the voltage at node $N_{12}'$ is lower than the threshold voltage. The transmitter $TX_1'$ and the receiver $RX_1'$ are connected by a transmission line having a resistance of $R_1$ whose value is hundreds of Ω.

Also, a transmitter $TX_2'$ for receiving a horizontal start pulse $HST_{in}$ is constructed by a CMOS inverter formed by a P-channel MOS transistor $Q_{21}'$ and an N-channel MOS transistor $Q_{n21}'$ and a voltage amplitude limiting P-channel MOS transistor $Q_{p22}'$ connected between the transistors $Q_{p21}'$ and $Q_{n21}'$. In this case, the definite bias voltage $VB_1'$ is applied to the gate of the transistor $Q_{p22}'$ to limit a low level of an output signal. For example, the low level of the output signal is limited by about 1.5V higher than the ground voltage GND such as 0V. Also, a receiver $RX_2'$ for receiving the horizontal start pulse signal $HST_{in}$ to generate a horizontal clock signal $HST_{out}$ is constructed by a load drain-gate connected N-channel MOS transistor $Q_{n22}'$, a constant current source formed by a P-channel MOS transistor $Q_{p23}'$ whose gate receives the definite bias voltage $VB_2'$, and a voltage adjusting P-channel MOS transistor $Q_{p24}'$ whose gate receives the variable bias voltage $VB_3'$. The voltage adjusting P-channel MOS transistor $Q_{p24}'$ adjusts the voltage at node $N_2'$ to generate an adjusted voltage at node $N_{22}'$. In this case, the lower the bias voltage $VB_3'$, the higher the voltage at node $N_{22}'$. Also, the transistors $Q_{,n22}'$, $Q_{p24}'$ and $Q_{p23}'$ entirely serve as a current limiting means. The voltage at node $N_{22}'$ is supplied to an inverter $INV_{21}'$ for wave-shaping the voltage at node $N_{22}'$, and is inverted by an inverter $INV_{22}'$. In this case, since the inverter $INV_{21}'$ has a threshold voltage such as 2.3V, the voltage at node $N_{22}'$ is changed to a low level signal (=GND) or a high level signal (=$V_{DD}$) in accordance with whether or not the voltage at node $N_{22}'$ is lower than the threshold voltage. The transmitter $TX_2'$ and the receiver $RX_2'$ are connected by a transmission line having a resistance of $R_2'$ whose value is hundreds of Ω.

Further, a transmitter $TX_3'$ for receiving digital data $D1_{in}$ is constructed by a CMOS inverter formed by a P-channel MOS transistor $Q_{p31}'$ and an N-channel MOS transistor $Q_{n31}'$ and a voltage amplitude limiting P-channel MOS transistor $Q_{p32}'$ connected between the transistors $Q_{p31}'$ and $Q_{n31}'$. In this case, the definite bias voltage $VB_1'$ is applied to the gate of the transistor $Q_{p32}'$ to limit a low level of an output signal. For example, the low level of the output signal is limited by about 1.5V lower than a ground voltage GND such as 0V. Also, a receiver $RX_3'$ for receiving the digital data $D1_{in}$ to generate digital data $D1_{out}$ is constructed by a load drain-gate connected N-channel MOS transistor $Q_{n32}'$, a constant current source formed by a P-channel MOS transistor $Q_{p33}'$ whose gate receives the definite bias voltage $VB_2'$, and a voltage adjusting P-channel MOS transistor $Q_{p34}'$ whose gate receives the variable bias voltage $VB_3'$. The voltage adjusting P-channel MOS transistor $Q_{p34}'$ adjusts the voltage at node $N_{31}'$ to generate an adjusted voltage at node $N_{32}'$. In this case, the lower the bias voltage $VB_3'$, the higher the voltage at node $N_{32}'$. Also, the transistors $Q_{n32}'$, $Q_{p34}'$ and $Q_{p33}'$ entirely serve as a current limiting means. The voltage at node $N_{32}'$ is supplied to an inverter $INV_{31}'$ for wave-shaping the voltage at node $N_{32}'$, and is inverted by an inverter $INV_{32}'$. In this case, since the inverter $INV_{31}'$ has a threshold voltage such as 2.3V, the voltage at node $N_{32}'$ is changed to a low level signal (=GND) or a high level signal (=VDD) in accordance with whether or not the voltage at node $N_{32}'$ is lower than the threshold voltage. The transmitter $TX_3'$ and the receiver $RX_3'$ are connected by a transmission line having a resistance of $R_3$ whose value is hundreds of Ω.

Similar transmitters, receivers and transmission lines are provided for digital data D2, D3, . . . , D8 and so on.

A bias circuit BC' receives the horizontal clock signal $HCK_{out}$ from the receiver $RX_1'$ and transmits the bias voltage $VB_3'$ to the gates of the voltage adjusting transistors $Q_{p14}'$, $Q_{p24}'$, $Q_{p34}'$, . . . , of the receivers $RX_1'$, $RX_2'$, $RX_3'$, . . . .

The bias circuit BC' is constructed by a differential amplifier DA' for differentially amplifying the horizontal clock signal $HCK_{out}$ and its inverted signal, and a capacitor $C_o'$ charged and discharged by the differential amplifier DA'. The differential amplifier DA' is formed by a differential pair including N-channel MOS transistors $Q_{n01}$' and $Q_{n02}$' controlled by the horizontal clock signal $HCK_{out}$ and its inverted signal, respectively, a current mirror circuit formed by P-channel MOS transistors $Q_{p01}$' and $Q_{p02}$', and a switch formed by a P-channel MOS transistor $Q_{p03}$'. Note that the transistors $Q_{n01'}$ *and* $Q_{n02}$' have the same dimension, and the transistors $Q_{p01}$' and $Q_{p02}$' have the same dimension, in order to respond to the horizontal clock signal $HCK_{out}$ which has a 50% duty ratio. Also, the transistor $Q_{p03}$' is controlled by the bias voltage $VB_3$', in order to prevent the receiver $RX_1$' from self-oscillating.

Figure 9:
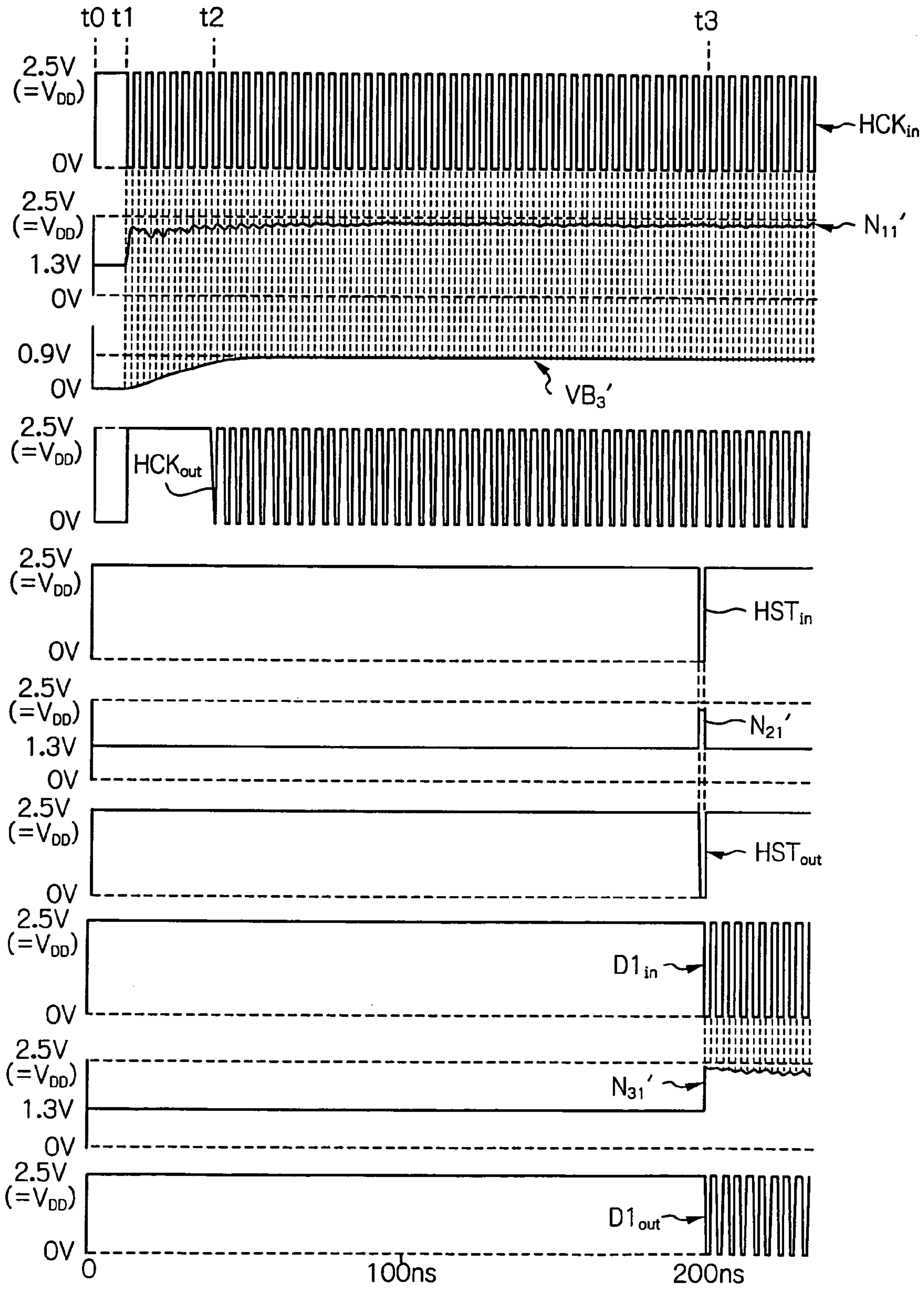
FIG. 9 is a timing diagram for explaining the operation of the circuit of FIG. 8.

The operation of the signal transmission circuit of FIG. 8 is explained next with reference to FIG. 9, where $V_{DD}$ is 2.5V, the frequency of the horizontal clock signal HCK is 250 $MH_z$, and the resistances $R_1$, $R_2$, $R_3$, . . . are 100Ω.

First, at time t0, in the transmitter $TX_1$', when the horizontal clock signal HCKin is high (=$V_{DD}$), the transistors $Q_{p11}$' and $Q_{n11}$' are turned OFF and ON, respectively, so that the output voltage is low (=$VB_1$'+$V_{GS}$, where $V_{GS}$ is a gate-to-source voltage of the transistor $Q_{p12}$'). For example, if $VB_1$' is 0.5V and $V_{GS}$ is 0.8V, $VB_1$'+$V_{GS}$=1.3V. As a result, in the receiver $RX_1$', the voltage at node $N_{11}$' is low (=1.3V). In this case, since the voltage at node $N_{12}$' is sufficiently lower than the threshold voltage (=2.3V) of the inverter $INV_{11}$', the horizontal clock signal $HCK_{out}$ is low (=GND). Therefore, in the bias circuit BC', the transistors $Q_{n01}$' and $Q_{n02}$' are turned OFF and ON, respectively the capacitor $C_0$' is discharged to GND, so that the bias voltage $VB_3$' is low (=GND).

Next, at time t1, the horizontal clock signal $HCK_{in}$ is supplied to the transmitter $TX_1$'. As a result, in the receiver $RX_1$', the voltage at node $N_{12}$' is rapidly increased, so that the voltage at node $N_{12}$' may become higher than the threshold voltage (=2.3V) of the inverter $INV_{11}$'. Thus, the horizontal clock signal $HCK_{out}$ is high (=$V_{DD}$). Therefore, in the bias circuit BC', the transistors $Q_{n01}$' and $Q_{n02}$' are turned ON and OFF, respectively, the capacitor $C_0$' is gradually charged, so that the bias voltage $VB_3$' is gradually increased.

When the bias voltage $VB_3$' is gradually decreased, the voltage at node $N_{11}$' is adjusted by the transistor $Q_{p14}$' to increase the voltage at node $N_{12}$'. Finally, at time t2, the voltage at node $N_{12}$' reaches the threshold voltage (=2.3V) of the inverter $INV_{11}$', so that the bias voltage $VB_3$' is converged to a definite value such as 0.9V.

Next, at time t3 when a period of time has sufficiently lapsed after time t2, a horizontal start pulse signal $HST_{in}$, digital data $\mathbf{D1}_{in}$ and so on are supplied to the transmitters $TX_2$', $TX_3$', . . . . As a result, since the bias voltage $VB_3$' is supplied commonly to the receivers $RX_2$', $RX_3$', . . . , the voltages at nodes $N_{21}$', $N_{31}$', . . . are immediately changed, so that a horizontal clock signal $HST_{out}$, digital data $\mathbf{D1}_{out}$ and so on can be optimally regenerated or received.

In FIG. 8, since the bias voltage $VB_3$' is optimally supplied to the receivers $RX_1$', $RX_2$', $RX_3$', . . . , the transmission of signals can be at a higher frequency than 200 MHz. Also, since each of the transmitters $TX_1$', $TX_2$', $TX_3$', . . . has a voltage amplitude limiting function, the power consumption therein can be decreased. Note that this power consumption is in proportion to the squared voltage amplitude. Further, since each of the receivers $RX_1$', $RX_2$', $RX_3$', . . . has a current limiting function and a voltage adjusting function, the power consumption therein can be decreased. Note that this power consumption is in proportion to the current and the squared voltage amplitude. Additionally, since the transistors $Q_{n12}$' and $Q_{p14}$' of the receiver such as $RX_1$' serve as a current limiting means (several k Ω), when the transistor $Q_{p11}$' is turned ON, a current flowing through the transmission line ($R_1$) is very small (about 1 mA), which also would decrease the power consumption.

Additionally, since the bias voltage $VB_3$' derived from a steady signal, i.e., the horizontal clock signal $HCK_{out}$ is supplied to all the receivers $RX_1$', $RX_2$', $RX_3$', . . . , a non-steady signal such as a horizontal start pulse signal HST can be optimally received at a high frequency. Also, if the relative errors of the transmission lines $R_1$, $R_2$, $R_3$, . . . are small, a wide operation range can be obtained even when the absolute errors of the transmission lines $R_1$, $R_2$, $R_3$, . . . are large.

In FIGS. 6 and 8, although the bias circuit BC or BC' is provided to complicate the signal transmission circuit, only one bias circuit BC or BC' is provided commonly for all the receivers $RX_1$, $RX_2$, $RX_3$, . . . or $RX_1$', $RX_2$', $RX_3$', . . . , so that the signal transmission circuit is hardly complicated.

As explained hereinabove, according to the present invention, a simple signal transmission circuit capable of decreasing the power consumption can be obtained.

The invention claimed is:

1. A signal transmission circuit comprising:

first and second power supply lines;

a first transmission line;

a first transmitter, connected to an input of said first transmission line and powered by said first and second power supply terminals, for receiving a first input signal to transmit a signal corresponding to said first input signal to the input of said first transmission line, a voltage amplitude of said transmitted signal being smaller than a voltage amplitude defined by said first and second power supply terminals;

a first receiver, connected to an output of said first transmission line and powered by said first and second power supply terminals, for receiving said transmitted signal, adjusting a voltage of said received signal in accordance with a bias voltage to generate a voltage adjusted signal, and wave-shaping said voltage adjusted signal to generate a first output signal; and a bias circuit, connected to said first receiver and powered by said first and second power supply terminals, for differentially amplifying said first output signal and an inverted signal thereof to generate said bias voltage, said bias circuit including a capacitor charged and discharged in accordance with said bias voltage.

2. The signal transmission circuit as set forth in claim 1, wherein said first receiver increases or decreases a difference between the voltage of said received signal and the voltage of said voltage adjusted signal in accordance with a change of said bias voltage.

3. The signal transmission circuit as set forth in claim 1, wherein said first transmitter comprises:

a first P-channel MOS transistor having a source connected to said first power supply terminal, a gate for receiving said first input signal, and a drain;

a first N-channel MOS transistor having a source connected to said second power supply terminal, a gate for receiving said first input signal, and a drain connected to the input of said first transmission line;

a second N-channel MOS transistor connected between the drain of said first P-channel MOS transistor and the drain of said first N-channel MOS transistor, a definite voltage being applied to a gate of said second N-channel MOS transistor.

4. The signal transmission circuit as set forth in claim 3, wherein said first receiver comprises:

a load connected to said first power supply terminal;

a current source connected to said second power supply terminal;

a third N-channel MOS transistor, connected between said load and said current source, said third N-channel MOS transistor having a gate for receiving said bias voltage; and a wave-shaper, connected to a node between said load and said third N-channel MOS transistor and powered by said first and second power supply terminals, for comparing a voltage at said node with a threshold voltage.

5. The signal transmission circuit as set forth in claim 4, wherein said first receiver further comprises an inverter connected to said wave-shaper.

6. The signal transmission circuit as set forth in claim 5, wherein said bias circuit further includes:

second and third P-channel MOS transistor, connected to said first power supply terminal and controlled by said first output signal and its inverted signal, respectively;

a current mirror circuit formed by fourth and fifth N-channel MOS transistors having an input connected to said second P-channel MOS transistor and output connected to said third P-channel MOS transistor and said capacitor; and a sixth N-channel MOS transistor connected between said current mirror circuit and said second power supply terminal, said capacitor being connected to said second power supply terminal.

7. The signal transmission circuit as set forth in claim 1, wherein said first transmitter comprises:

a first P-channel MOS transistor having a source connected to said first power supply terminal, a gate for receiving said first input signal, and a drain connected to the input of said first transmission line;

a first N-channel MOS transistor having a source connected to said second power supply terminal, a gate for receiving said first input signal, and a drain;

a second P-channel MOS transistor connected between the drain of said first P-channel MOS transistor and the drain of said first N-channel MOS transistor, a definite voltage being applied to a gate of said second P-channel MOS transistor.

8. The signal transmission circuit as set forth in claim 7, wherein said first receiver comprises:

a load connected to said second power supply terminal;

a current source connected to said first power supply terminal;

a third P-channel MOS transistor, connected between said load and said current source, said third P-channel MOS transistor having a gate for receiving said bias voltage; and a wave-shaper, connected to a node between said load and said third P-channel MOS transistor and powered by said first and second power supply terminals, for comparing a voltage at said node with a threshold voltage.

9. The signal transmission circuit as set forth in claim 8, wherein said first receiver further comprises an inverter connected to said wave-shaper.

10. The signal transmission circuit as set forth in claim 9, wherein said bias circuit further includes:

second and third N-channel MOS transistor, connected to said second power supply terminal and controlled by said first output signal and its inverted signal, respectively;

a current mirror circuit formed by fourth and fifth P-channel MOS transistors having an input connected to said second N-channel MOS transistor and output connected to said third N-channel MOS transistor and said capacitor; and a sixth P-channel MOS transistor connected between said current mirror circuit and said first power supply terminal, said capacitor being connected to said first power supply terminal.

11. The signal transmission circuit as set forth in claim 1, further comprising:

at least one second transmission line;

at least one second transmitter, connected to an input of said second transmission line and powered by said first and second power supply terminals, for receiving a second input signal to transmit a signal corresponding to said second input signal to the input of said second transmission line, a voltage amplitude of said transmitted signal being smaller than a voltage amplitude defined by said first and second power supply terminals;

at least one second receiver, connected to an output of said second transmission line and powered by said first and second power supply terminals, for receiving said transmitted signal, adjusting a voltage of said received signal in accordance with said bias voltage to generate a voltage adjusted signal, and wave-shaping said voltage adjusted signal to generate a second output signal.

12. The signal transmission circuit as set forth in claim 11, wherein said second transmitter has the same configuration as said first transmitter, and said second receiver has the same configuration as said first receiver.

* * * * *